(12) United States Patent
Chang

(10) Patent No.: US 11,269,385 B2
(45) Date of Patent: Mar. 8, 2022

(54) MOTHERBOARD ASSEMBLY AND BRACKET

(71) Applicants: Inventec (Pudong) Technology Corporation, Shanghai (CN); INVENTEC CORPORATION, Taipei (TW)

(72) Inventor: Kuo En Chang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/019,639

(22) Filed: Sep. 14, 2020

(65) Prior Publication Data
US 2021/0382530 A1    Dec. 9, 2021

(30) Foreign Application Priority Data

Jun. 5, 2020  (CN) .................... CN202010507180.8

(51) Int. Cl.
*G06F 1/18*       (2006.01)
*H05K 7/14*       (2006.01)

(52) U.S. Cl.
CPC .............. *G06F 1/186* (2013.01); *G06F 1/184* (2013.01); *G06F 1/185* (2013.01); *H05K 7/1435* (2013.01)

(58) Field of Classification Search
CPC .......... G06F 1/185; G06F 1/186; G06F 1/184; H05K 7/1435
See application file for complete search history.

(56) References Cited

U.S. PATENT DOCUMENTS

| 8,625,258 B2 * | 1/2014 | Li | G06F 1/185 |
| | | | 361/679.01 |
| 8,804,356 B2 * | 8/2014 | Tsai | G06F 1/186 |
| | | | 361/759 |
| 2008/0198564 A1 * | 8/2008 | Chang | G06F 1/186 |
| | | | 361/759 |

* cited by examiner

*Primary Examiner* — James Wu
(74) *Attorney, Agent, or Firm* — Locke Lord LLP; Tim Tingkang Xia, Esq.

(57) ABSTRACT

The invention provides a motherboard assembly. The motherboard assembly includes a circuit board, an expansion card connector, an expansion card assembly, a bracket and a fastener. The expansion card connector is disposed on the circuit board. The expansion card assembly includes a cage, an adapter card, and at least one expansion card. The adapter card is installed on the cage and includes an electrical connector. The electrical connector is inserted into the expansion card connector, and the expansion card is installed on the adapter card. The bracket includes a first mount plate and a second mount plate connected to each other. The first mount plate is fixed on the circuit board, and the second mount plate is located farther away from the circuit board than the first mount plate. The fastener is disposed through the cage and screwed into the second mount plate of the bracket.

7 Claims, 6 Drawing Sheets

MOTHERBOARD ASSEMBLY AND BRACKET

CROSS-REFERENCE TO RELATED APPLICATIONS

This non-provisional application claims priority under 35 U.S.C. § 119(a) on Patent Application No(s). 202010507180.8 filed in China on Jun. 5, 2020, the entire contents of which are hereby incorporated by reference.

BACKGROUND OF THE INVENTION

Technical Field of the Invention

The invention relates to a motherboard assembly and a bracket, more particularly to a motherboard assembly and a bracket for an expansion card assembly.

Description of the Related Art

As the electronic technology progresses, electronic devices are demanded to have a powerful computing performance, high processing speed, and small size. In addition, to be more competitive, the electronic device is required to be thinner, lighter, and powerful while featuring expandable function.

In a conventional server, the installation of a set of PCIe expansion cards is to assemble all of the expansion cards to one cage and then to fix that cage to a circuit board by fasteners.

It is known that the higher the expansion card assembly is, the longer the fasteners required for fixation of the assembly. However, longer fasteners may increase the torque that the expansion card assembly applies to the circuit board, and which may cause the damages to the circuit board and components thereon due to an unexpected impact.

SUMMARY OF THE INVENTION

The invention provides a motherboard assembly and a bracket which are capable of reducing the torque that the expansion card applies on the circuit board.

One embodiment of the invention provides a motherboard assembly. The motherboard assembly includes a circuit board, an expansion card connector, an expansion card assembly, a bracket and a fastener. The expansion card connector is disposed on the circuit board. The expansion card assembly includes a cage, an adapter card, and at least one expansion card. The adapter card is installed on the cage and includes an electrical connector. The electrical connector is inserted into the expansion card connector, and the expansion card is installed on the adapter card. The bracket includes a first mount plate and a second mount plate connected to each other. The first mount plate is fixed on the circuit board, and the second mount plate is located farther away from the circuit board than the first mount plate. The fastener is disposed through the cage and screwed into the second mount plate of the bracket.

Another embodiment of the invention provides a bracket. The bracket is configured to be assembled with a circuit board and an expansion card assembly. The bracket includes a first mount plate and a second mount plate. The first mount plate is configured to be fixed on the circuit board. The second mount plate is connected to the first mount plate. The second mount plate is located farther away from the circuit board than first mount plate, and the second mount plate is configured for a fixation of the expansion card assembly.

According to the motherboard assembly and the bracket, since the second mount plate is spaced apart from the circuit board by a distance, and the fastener is fixed to the circuit board via the bracket, the fastener could be shorter than the fastener needed to be directly screwed to the circuit board. Therefore, the torque that the expansion card assembly applies on the circuit board can be reduced, thereby maintaining the lifespan of the motherboard assembly.

BRIEF DESCRIPTION OF THE DRAWINGS

The present invention will become more fully understood from the detailed description given hereinbelow and the accompanying drawings which are given by way of illustration only and thus are not limitative to the present invention and wherein.

DETAILED DESCRIPTION

Figure 1:
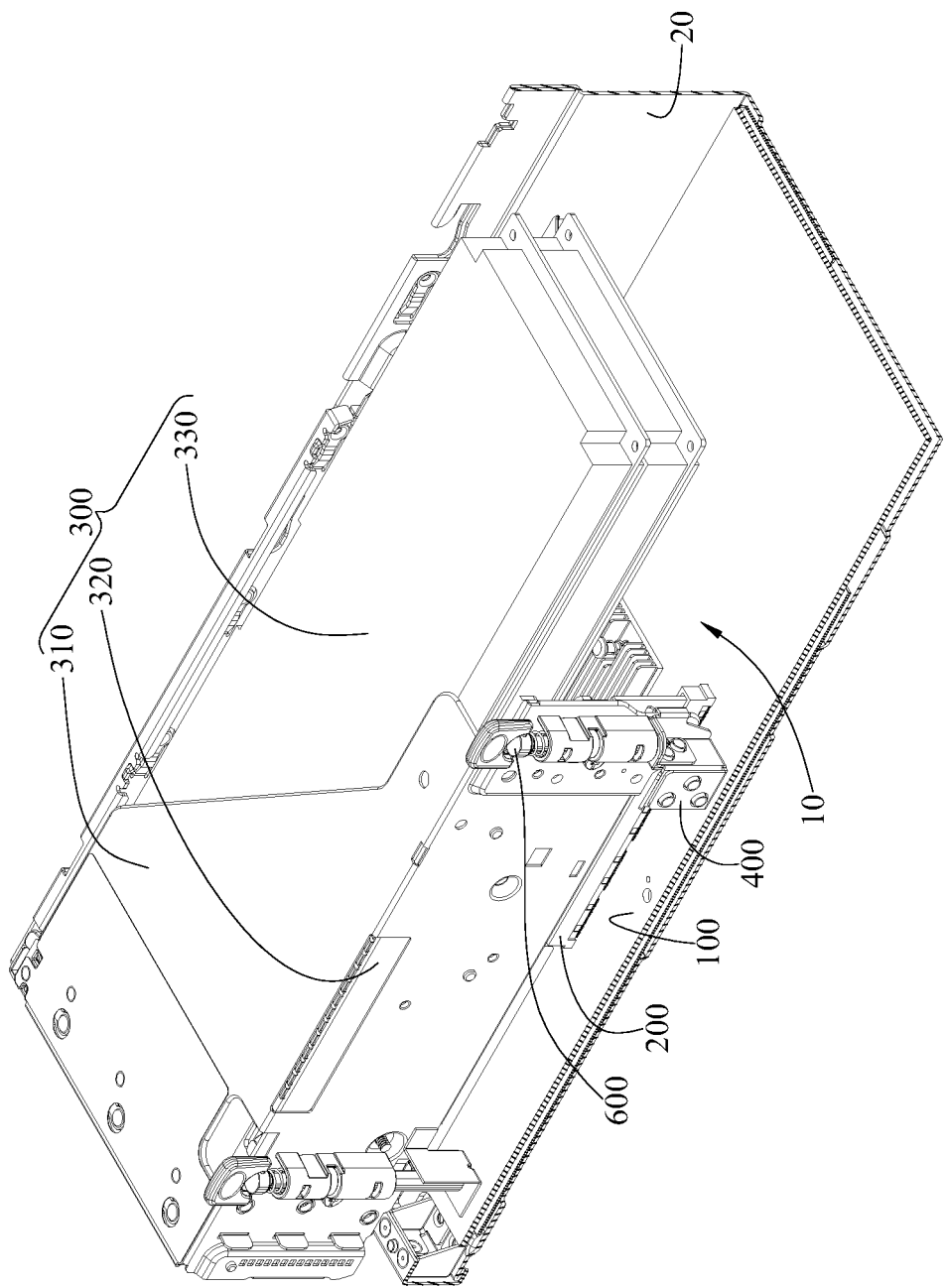
FIG. 1 is a perspective view of a motherboard assembly according to one embodiment of the invention when the motherboard assembly is installed on a casing.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present invention is not limited thereto. Furthermore, for the purpose of illustration, some of the structures and components in the figures are simplified, and wires, reference lines or buses are omitted in some of the figures.

Moreover, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
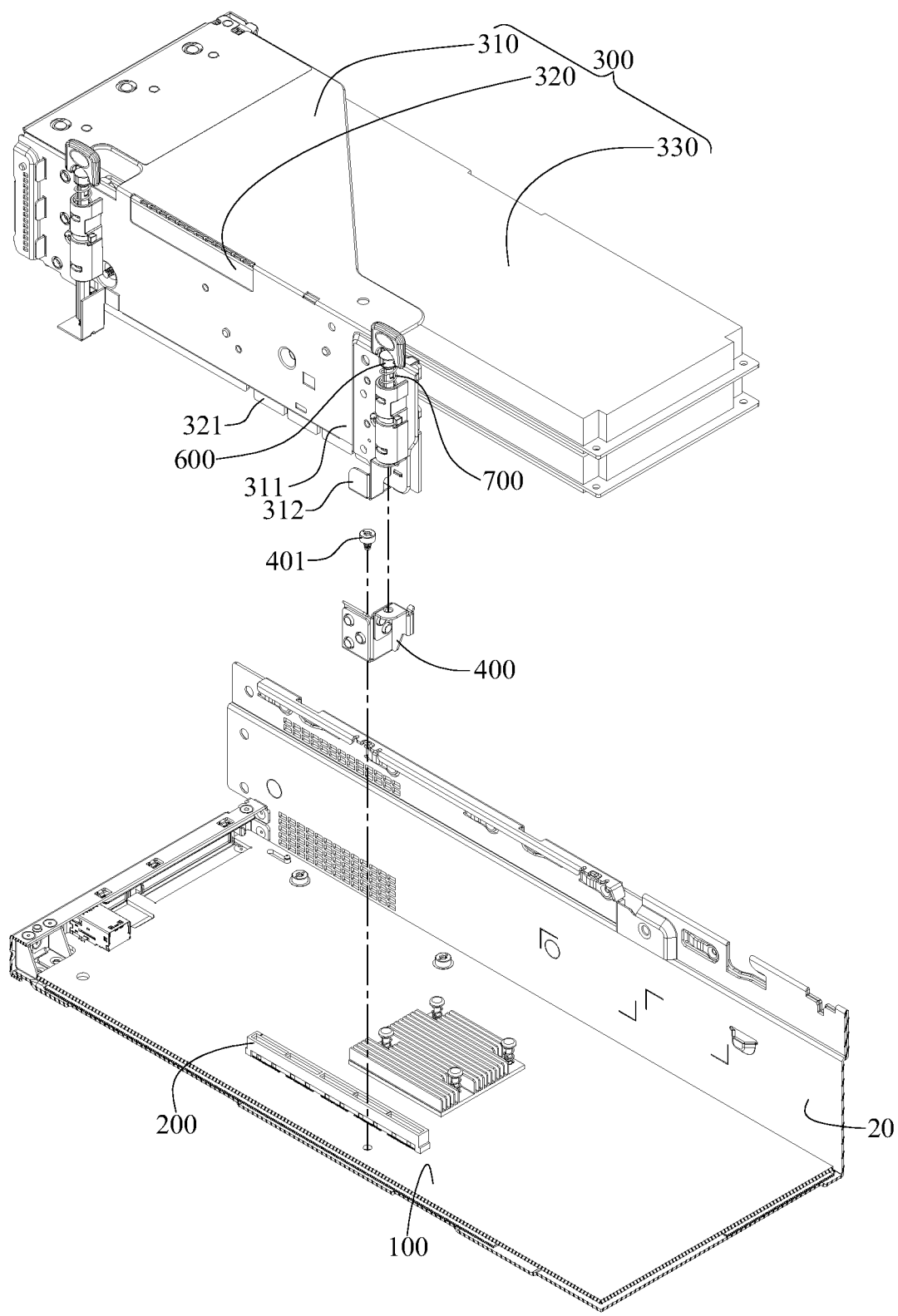
FIG. 2 is an exploded view of the motherboard assembly in FIG. 1.
Figure 3:
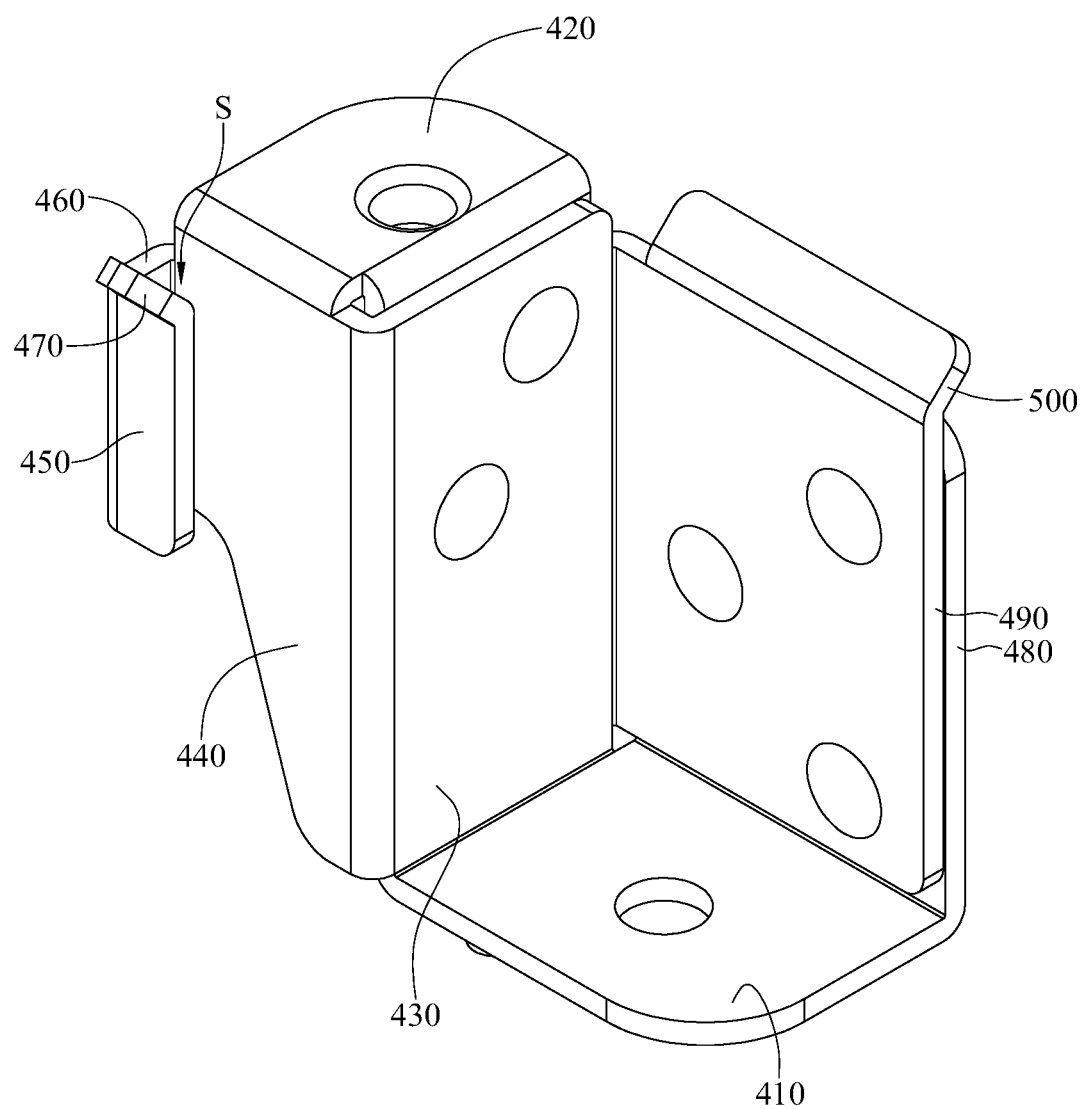
FIG. 3 is a perspective view of a bracket of the motherboard assembly in FIG. 2.

Referring to FIGS. 1 to 4, there are shown a perspective view of a motherboard assembly 10 according to one embodiment of the invention when the motherboard assembly 10 is installed on a casing 20, an exploded view of the motherboard assembly 10 in FIG. 1, a perspective view of a bracket 400 of the motherboard assembly 10 in FIG. 2, and a side view of the motherboard assembly 10 in FIG. 1 when an expansion card assembly 300 and an expansion card connector 200 are separated from each other.

In this embodiment, the motherboard assembly 10 is installed on a casing 20. The casing 20 is, for example, a housing for supporting components of a server. The motherboard assembly 10 includes a circuit board 100, an expansion card connector 200, an expansion card assembly 300, a bracket 400, and a fastener 600.

The expansion card connector 200 is, for example, a PCIe connector. The expansion card connector 200 is disposed on the circuit board 100. The expansion card assembly 300 includes a cage 310, an adapter card 320, and a plurality of expansion cards 330. The cage 310 includes a cage body 311 and a mount tab 312. The mount tab 312 is connected to the cage body 311. The adapter card 320 is installed on the cage body 311 of the cage 310. The adapter card 320 includes an electrical connector 321. The electrical connector 321 is, for example, a golden finger connector. The electrical connector 321 is inserted into the expansion card connector 200. The expansion cards 330 are installed on the adapter card 320.

In this embodiment, the quantity of the expansion cards is not restricted in the invention; in some other embodiments, the expansion card assembly may have one expansion card.

The bracket 400 includes a first mount plate 410 and a second mount plate 420 connected to each other. The first mount plate 410 is fixed on the circuit board 100 via, for example, a fastener 401, and the second mount plate 420 is located farther away from the circuit board 100 than the first mount plate 410, and the second mount plate 420 is spaced apart from the circuit board 100 by a distance D. The first mount plate 410 and the second mount plate 420 each have, for example, a screw hole for the fasteners to be directly screwed into the screw holes of the first mount plate 410 and the second mount plate 420, but the present invention is not limited thereto; in some other embodiments, the first mount plate 410 and the second mount plate 420 may have through holes without screw threads; in such a case, the fasteners penetrating through the through holes can be fixed in position with nuts.

Specifically, the bracket 400 may further include a first connection plate 430, a second connection plate 440, a guiding plate 450, a third connection plate 460, an inclined guiding plate 470, a fourth connection plate 480, a fifth connection plate 490, and an inclined reinforcement plate 500. The first connection plate 430 connects the first mount plate 410 and the second mount plate 420. The second connection plate 440 connects the second mount plate 420 and the first connection plate 430. The guiding plate 450 is connected to the second connection plate 440 via the third connection plate 460, and the guiding plate 450, the second connection plate 440 and the third connection plate 460 together form a guiding slot S therebetween. The cage body 311 of the cage 310 is partially located in the guiding slot S. The inclined guiding plate 470 is connected to a side of the guiding plate 450 away from the first mount plate 410, such that the inclined guiding plate 470 can assist the movement of the cage body 311 of the cage 310 into the guiding slot S.

The fourth connection plate 480 is connected to the first mount plate 410. The fifth connection plate 490 is connected to the first connection plate 430 and stacked on the fourth connection plate 480. The fifth connection plate 490 and the fourth connection plate 480 are riveted with each other. The inclined reinforcement plate 500 is connected to a side of the fifth connection plate 490 away from the first mount plate 410, such that the inclined reinforcement plate 500 can increase the structural strength of the bracket 400.

In this embodiment, the first mount plate 410, the second mount plate 420, the first connection plate 430, the second connection plate 440, the third connection plate 460, the fourth connection plate 480, the fifth connection plate 490, the guiding plate 450, the inclined guiding plate 470 and the inclined reinforcement plate 500 of the bracket 400 are formed by bending a metal plate.

In addition, the height of the bracket 400 can be determined according to the highest component disposed on the circuit board 100. For example, when a connector for a data storage device is the highest component among all of components on the circuit board 100, the height of the bracket 400 can be smaller than or as the same as that of the connector, thereby saving the material for packing the circuit board 100 and the components thereon.

The fastener 600 is disposed through the cage 310 and screwed into the second mount plate 420 of the bracket 400. In this embodiment, the fastener 600 is inseparably disposed on the cage 310, but the present invention is not limited thereto; in some other embodiments, the fastener may be detachably disposed on from the cage.

The elastic component 700 is sleeved on the fastener 600. The elastic component 700 can force the fastener 600 to move away from the circuit board 100 when there is no external force applying on the fastener 600 and the fastener 600 is not fixed to another component other than the cage 310.

Figure 4:
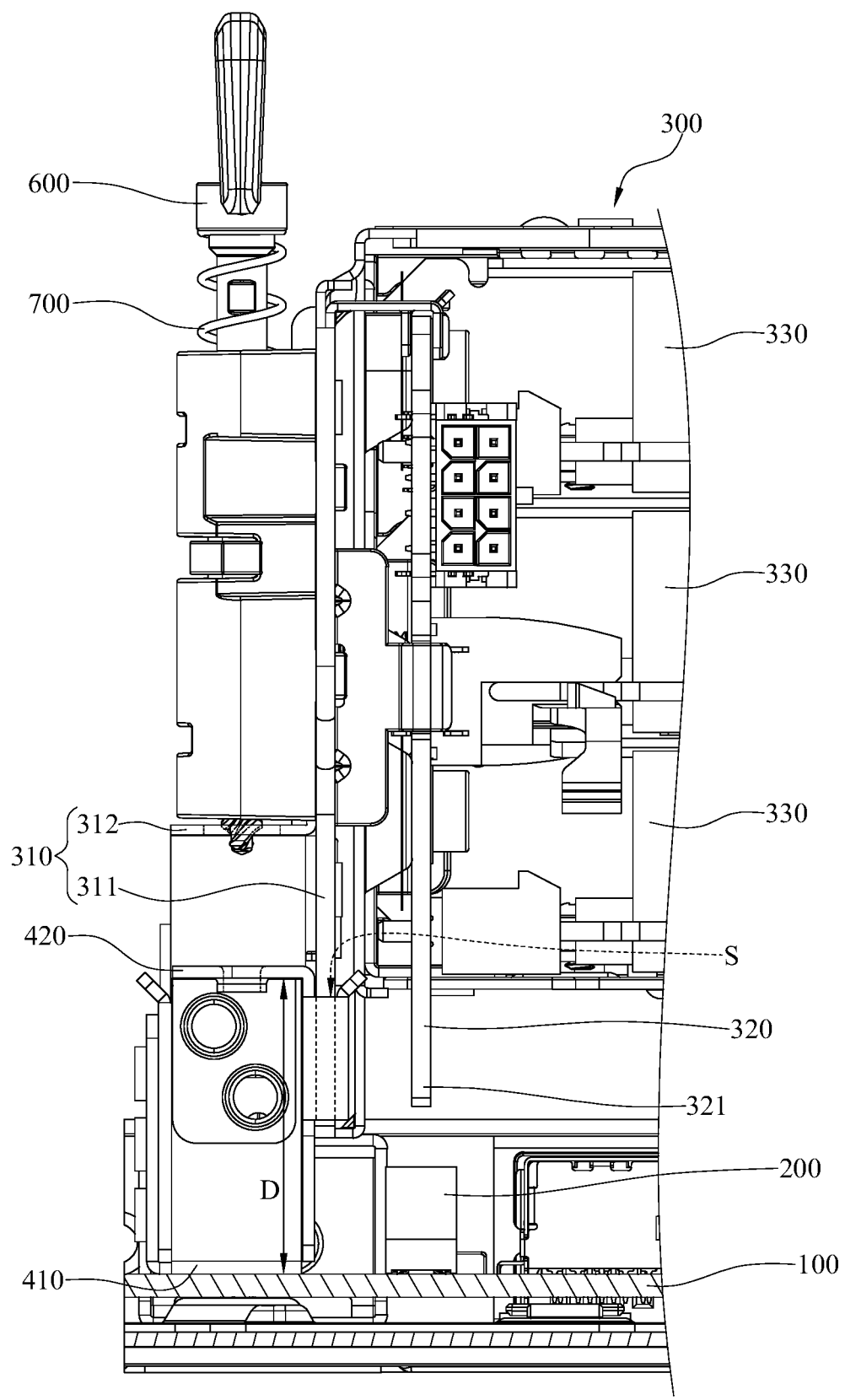
FIG. 4 is a side view of the motherboard assembly in FIG. 1 when an expansion card assembly and an expansion card connector are separated from each other.
Figure 5:
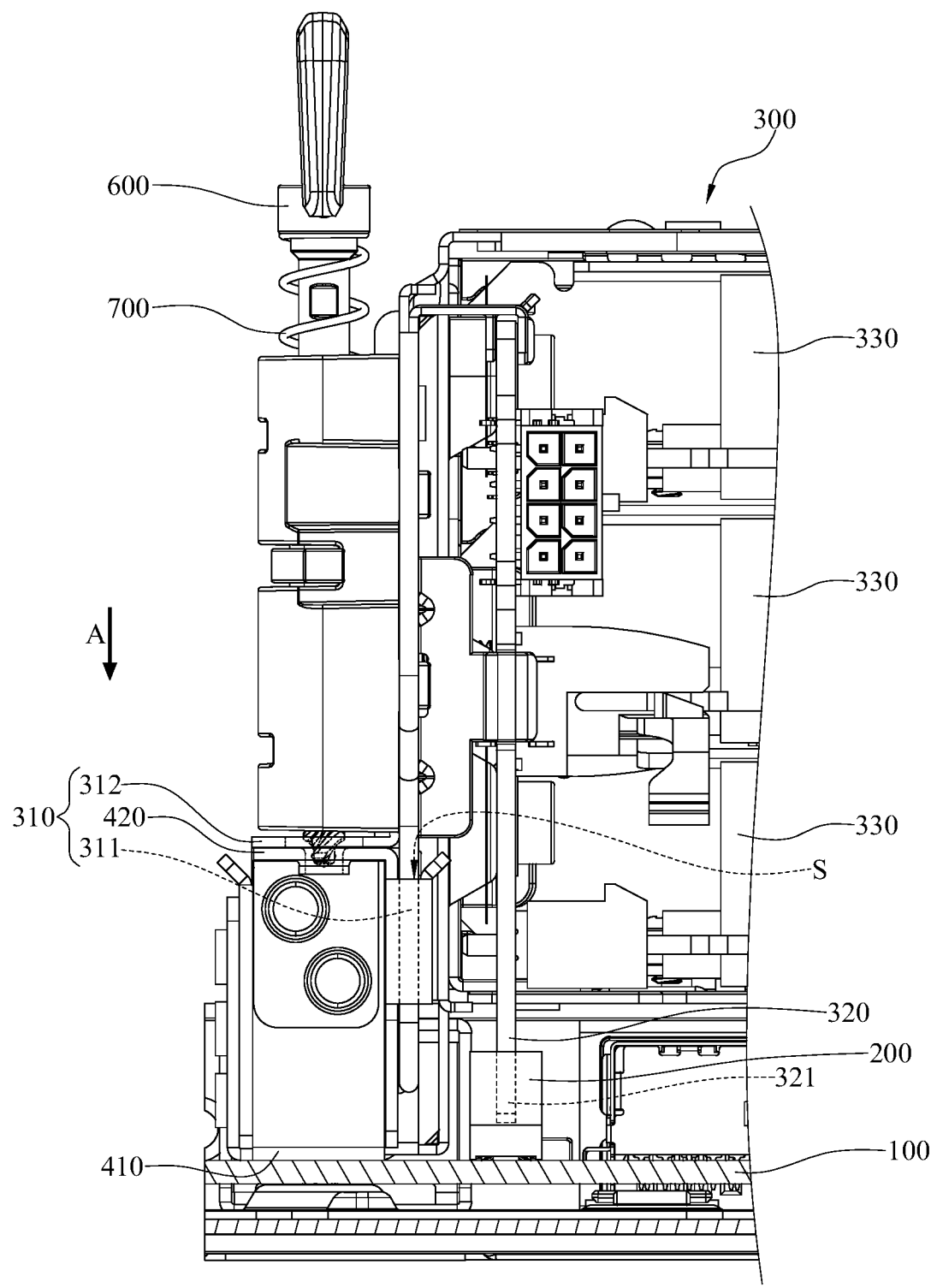
FIG. 5 is a side view of the motherboard assembly in FIG. 4 when the expansion card assembly are installed on the expansion card connector.
Figure 6:
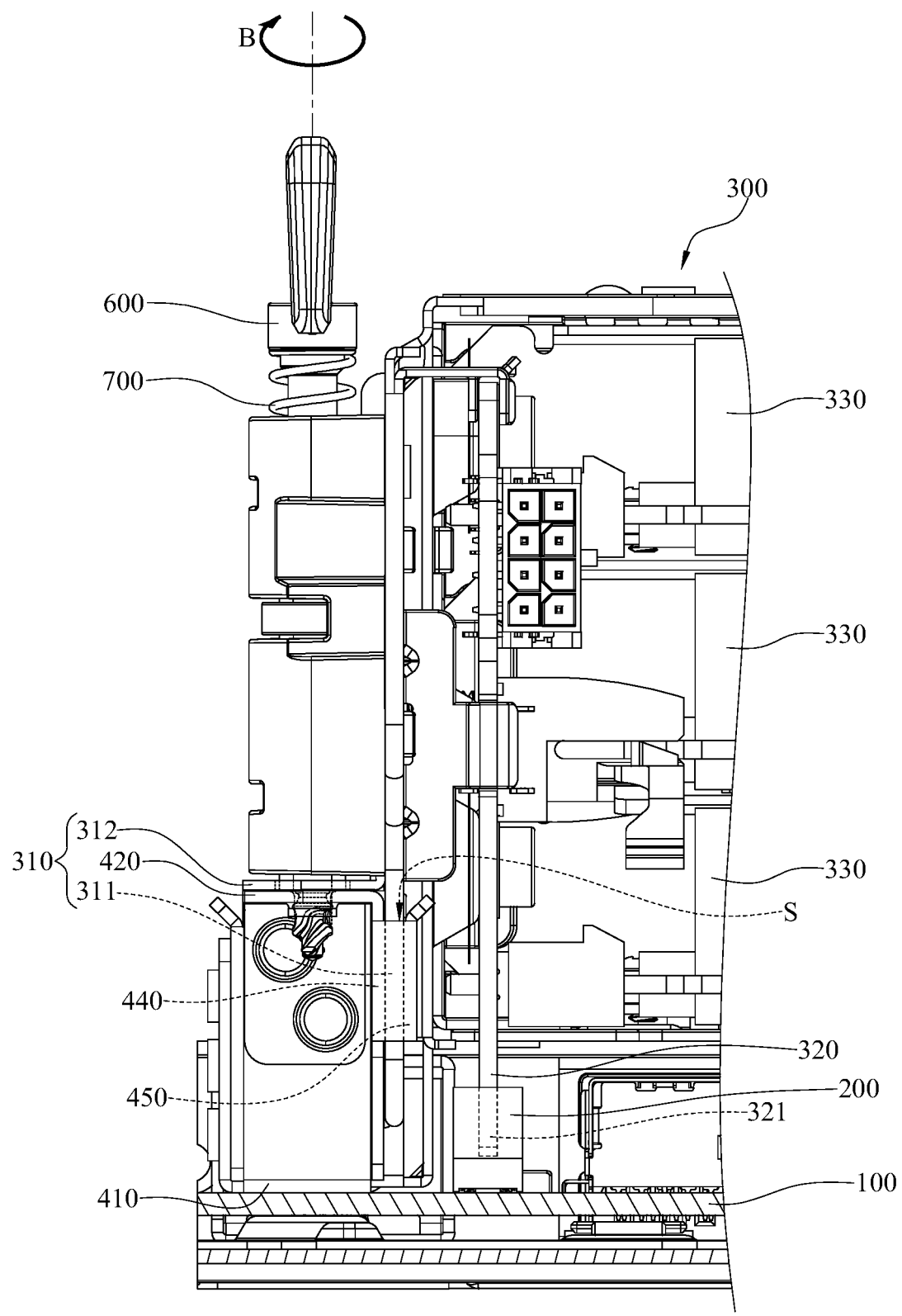
FIG. 6 is a side view of the motherboard assembly in FIG. 5 when a fastener is screwed into the bracket.

The installation process of the expansion card assembly 300 will be described in the following paragraphs. Referring to FIGS. 4 to 6, there is shown a side view of the motherboard assembly 10 in FIG. 4 when the expansion card assembly 300 are installed on the expansion card connector 200 and a side view of the motherboard assembly 10 in FIG. 5 when the fastener 600 is screwed into the bracket 400.

As shown in FIG. 4, the expansion card assembly 300 is located above the circuit board 100, and the adapter card 320 of the expansion card assembly 300 is not yet inserted into the expansion card connector 200.

Then, as shown in FIG. 5, the expansion card assembly 300 is forced to move towards the circuit board 100 along a direction A so as to insert the electrical connector 321 of the adapter card 320 into the expansion card connector 200.

During the insertion of the adapter card 320 into the expansion card connector 200, the expansion card connector 200 and the adapter card 320 may be covered by the cage 310 and the expansion cards 330 to make the user unable to clearly see the whole insertion process, but part of the cage body 311 of the cage 310 of the expansion card assembly 300 can be guided by the guide hole S to make sure the process to be done. In other words, the guide hole S of the bracket 400 can assist the insertion of the expansion card assembly 300 into the expansion card connector 200 without actually seeing the expansion card connector 200 and the adapter card 320.

Then, as shown in FIG. 6, the fastener 600 is screwed to the second mount plate 420 of the bracket 400 along a direction B; that is, the fastener 600 is fixed to the circuit board 100 via the bracket 400 but not being directly screwed to the circuit board 100. Since the second mount plate 420 is spaced apart from the circuit board 100 by the distance D and the fastener 600 is fixed to the circuit board 100 via the bracket 400, the fastener 600 could be shorter than the fastener needed to be directly screwed to the circuit board 100. Therefore, the torque that the expansion card assembly 300 applies on the circuit board 100 can be reduced, thereby maintaining the lifespan of the motherboard assembly 10. In addition, since the cage body 311 of the cage 310 is partially limited by the second connection plate 440 and the guiding plate 450, an unexpected movement of the expansion card assembly 300 can be reduced, thereby facilitating the fixation of the expansion card assembly 300.

According to the motherboard assembly and the bracket, since the second mount plate is spaced apart from the circuit board by a distance, and the fastener is fixed to the circuit board via the bracket, the fastener could be shorter than the fastener needed to be directly screwed to the circuit board. Therefore, the torque that the expansion card assembly applies on the circuit board can be reduced, thereby maintaining the lifespan of the motherboard assembly.

In addition, since the cage body of the cage is partially limited by the second connection plate and the guiding plate, an unexpected movement of the expansion card assembly can be reduced, thereby facilitating the fixation of the expansion card assembly.

In one embodiment of the invention, the server can be adopted in the artificial intelligence computing or the edge computing. In addition, the server may be a 5G server, a cloud server or a vehicle network server.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A motherboard assembly, comprising:
   a circuit board;
   an expansion card connector, disposed on the circuit board;
   an expansion card assembly, comprising a cage, an adapter card, and at least one expansion card, wherein the adapter card is installed on the cage and comprises an electrical connector, the electrical connector is inserted into the expansion card connector, and the at least one expansion card is installed on the adapter card;
   a bracket, comprising a first mount plate and a second mount plate connected to each other, wherein the first mount plate is fixed on the circuit board, and the second mount plate is located farther away from the circuit board than the first mount plate; and
   a fastener, disposed through the cage and screwed into the second mount plate of the bracket;
   wherein the bracket further comprises a first connection plate, a second connection plate, a guiding plate, a third connection plate, and an inclined guiding plate, the first connection plate connects the first mount plate and the second mount plate, the second connection plate connects the second mount plate and the first connection plate, the guiding plate is connected to the second connection plate via the third connection plate, the guiding plate, the second connection plate, and the third connection plate together from a guiding slot therebetween, the cage is partially located in the guiding slot, and the inclined guiding plate is connected to the guiding plate away from the first mount plate.

2. The motherboard assembly according to claim 1, wherein the bracket further comprises a fourth connection plate, a fifth connection plate, and an inclined reinforcement plate, the fourth connection plate is connected to the first mount plate, the fifth connection plate is connected to the first connection plate and stacked on the fourth connection plate, and the inclined reinforcement plate is connected to a side of the fifth connection plate away from the first mount plate.

3. The motherboard assembly according to claim 2, wherein the first mount plate, the second mount plate, the first connection plate, the second connection plate, the third connection plate, the fourth connection plate, the fifth connection plate, the guiding plate, the inclined guiding plate and the inclined reinforcement plate of the bracket are formed by bending a metal plate.

4. A bracket, configured to be assembled with a circuit board and an expansion card assembly, comprising:
   a first mount plate, configured to be fixed on the circuit board; and
   a second mount plate, connected to the first mount plate, wherein the second mount plate is located farther away from the circuit board than first mount plate, and the second mount plate is configured for a fixation of the expansion card assembly;
   wherein the bracket further comprises a first connection plate, a second connection plate, a guiding plate, a third connection plate, a fourth connection plate and a fifth connection plate, the first connection plate connects the first mount plate and the second mount plate, the second connection plate connects the second mount plate and the first connection plate, the guiding plate is connected to the second connection plate via the third connection plate, the guiding plate, the second connection plate, and the third connection plate together form a guiding slot therebetween, and the guiding slot is configured to accommodate a part of the expansion card assembly, the fourth connection plate is connected to the first mount plate, the fifth connection plate is connected to the first connection plate and stacked on the fourth connection plate.

5. The bracket according to claim 4, wherein the bracket further comprises an inclined guiding plate, and the inclined guiding plate is connected to a side of the guiding plate away from the first mount plate.

6. The bracket according to claim 5, wherein the bracket further comprises an inclined reinforcement plate, the inclined reinforcement plate is connected to a side of the fifth connection plate away from the first mount plate.

7. The bracket according to claim 6, wherein the first mount plate, the second mount plate, the first connection plate, the second connection plate, the third connection plate, the fourth connection plate, the fifth connection plate, the guiding plate, the inclined guiding plate and the inclined reinforcement plate of the bracket are formed by bending a metal plate.

* * * * *